(12) United States Patent
McDougall

(10) Patent No.: US 8,944,786 B1
(45) Date of Patent: Feb. 3, 2015

(54) LOW ENERGY MAGNETIC SPA CIRCULATION SYSTEM

(76) Inventor: Eugene McDougall, Oakville (CA)

( * ) Notice: Subject to any disclaimer, the term of this patent is extended or adjusted under 35 U.S.C. 154(b) by 468 days.

(21) Appl. No.: 12/838,664

(22) Filed: Jul. 19, 2010

Related U.S. Application Data

(60) Provisional application No. 61/226,413, filed on Jul. 17, 2009.

(51) Int. Cl.
*F04D 13/02* (2006.01)
*A61H 33/00* (2006.01)

(52) U.S. Cl.
CPC .......... *A61H 33/0091* (2013.01); *F04D 13/024* (2013.01)
USPC ............................................ 417/420; 4/541.3

(58) Field of Classification Search
CPC .......................... A61H 33/0091; F04D 13/024
USPC .................................. 417/420; 4/541.1, 541.3
See application file for complete search history.

(56) References Cited

U.S. PATENT DOCUMENTS

| | | | |
|---|---|---|---|
| 3,481,586 A * | 12/1969 | Roberts | ........................ 366/264 |
| 4,308,994 A | 1/1982 | Perhats | |
| 4,853,987 A | 8/1989 | Jaworski | |
| 5,063,620 A | 11/1991 | Mersmann | |
| 5,314,589 A | 5/1994 | Hawley | |
| 5,414,878 A | 5/1995 | Booth | |
| 5,587,023 A | 12/1996 | Booth | |
| 5,794,280 A | 8/1998 | Hansen et al. | |
| 5,862,543 A | 1/1999 | Reynoso et al. | |
| 6,405,387 B1 | 6/2002 | Barnes | |
| 6,534,894 B1 | 3/2003 | Flowerday | |
| 7,111,334 B2 | 9/2006 | Chen | |
| 7,249,571 B2 * | 7/2007 | Allis | ............................ 119/261 |
| 7,393,188 B2 | 7/2008 | Lawyer et al. | |
| 2003/0196260 A1 | 10/2003 | Pettenon | |
| 2005/0211612 A1 | 9/2005 | Mattson, Jr. et al. | |
| 2006/0210412 A1 * | 9/2006 | Lawyer et al. | ................. 417/420 |
| 2009/0064406 A1 | 3/2009 | Lawyer et al. | |
| 2009/0158518 A1 | 6/2009 | Southon et al. | |

OTHER PUBLICATIONS

Popular Science, "Healthier Whirlpools", Feb. 2000, p. 38.

* cited by examiner

*Primary Examiner* — Charles Freay
*Assistant Examiner* — Philip Stimpert
(74) *Attorney, Agent, or Firm* — Greer, Burns & Crain, Ltd.

(57) ABSTRACT

A pedicure spa or hydrotherapy system for circulating fluid which includes a motor coupled magnetically with an impeller assembly on the wall of the pedicure spa or hydrotherapy system is disclosed. The system is designed to have low energy consumption and an ultra low profile while at the same time providing a pipeless water circulation that is easy to operate and clean. In addition, the invention minimizes the growth of bacteria within the pumping system as the impeller assembly is easily removed from the wall for cleaning without any mechanical aids. In certain embodiments, the magnetic propulsion and coupling device includes a multi-directional combination of strategically placed and alternating-pole magnets on magnet plates and additional magnets in the housing.

19 Claims, 15 Drawing Sheets

LOW ENERGY MAGNETIC SPA CIRCULATION SYSTEM

CROSS-REFERENCE TO RELATED APPLICATION

This application claims the benefit of U.S. Provisional Application No. 61/226,413 filed Jul. 17, 2009, which is hereby incorporated by reference.

BACKGROUND

The present disclosure concerns a pipeless fluid circulator for a pedicure spa, hydrotherapy system or other fluid container. The system relates to the field of fluid circulation, the elimination of bacteria growth within pipes and pump and the use of oriented magnetism for the improvement of performance and reduction of energy consumption.

Conventional pedicure spas, hot tubs and similar devices in which humans or animals soak or bathe generally utilize a central pump or motor, which is connected to several outlet jets that circulate the water in the tub around the user's body, e.g. feet in the case of a pedicure spa. Such circulation systems have the potential for significant health risk since water trapped in the pipes after the tub is drained has been proven to permit or promote the growth of bacteria, algae, fungus and mold. In dealing particularly with pedicure spas, users are very concerned about bacteria or other disease-causing agents that grow within the pipes and pumps and even in crevices or on surfaces of the spas. Consequently, pipes, pumps and inlets of spas or tubs may need periodic disassembly for cleaning, which in conventional systems is quite involved.

Conventional pumping systems for pedicure spas and hydrotherapy systems require one or more holes to be placed through the wall of the tub or other vessel to allow for fluid (e.g. water) circulation within. Each such hole has the potential for both leaking and creating small fissures where the growth of bacteria may harbor contagious diseases. A circulation system that eliminates holes through a tub or vessel would accordingly eliminate those possible contamination areas.

Fluid-circulation systems have been previously proposed for aquariums which incorporate a magnetic connection between a driving motor and a fluid impeller, These devices have frequently suffered from drawbacks in terms of energy consumption, effective connection through walls of the aquarium, and their considerable bulk.

SUMMARY

The present disclosure includes, among other things, a low energy pipeless magnetic circulation system for use in a variety of liquid containers, such as pedicure spas and hydrotherapy tubs. In particular embodiments, the system can include a motor assembly and an impeller assembly held together magnetically with a wall of a tub, vessel or other container between them. The motor assembly may include a motor connected to a housing, with a mounting bracket for stabilizing the housing against a tub, vessel or other container. The housing includes two fixed peripheral cylindrical neodymium magnets for holding the two assemblies together. Within the housing and connected to the motor is a transfer plate holding eight neodymium magnets. The magnets are oriented so that the polarity alternates from magnet to magnet. Electronic hardware and software may be provided that allows for the sequential start up and safe operation of the total unit, and may include circuitry and inputs (e.g. a keypad) for programming start and stop times, as well as a reed switch or Hall-effect device for interrupting the operating circuit (and thus the operation of the device) when the motor assembly and impeller assembly (or parts of them) are disconnected from each other.

The impeller assembly includes in certain particular embodiments a housing having two fixed peripheral cylindrical neodymium magnets that correspond with the fixed peripheral magnets in the motor assembly's housing. Within the impeller assembly housing is a plate holding eight cylindrical neodymium magnets. As with the motor assembly, the magnets in the impeller assembly's plate are arranged in alternating polarity, so that they are matched in attraction to the magnets of the motor assembly's plate. An impeller is provided within a thrust bearing having eight small glass balls in a circular ring divided with plastic spacers. An inner cap covers the impeller while allowing passages for water to enter toward the impeller and be driven away from the impeller, and an outer cap has passages to allow for drawing in fluid toward the impeller. A tube extending from the impeller assembly to a point above the liquid level in the tub is provided in certain embodiments for the drawing of air and its addition into the water stream for greater hydrotherapy action.

The motor in the motor assembly is connected directly to the magnet plate in particular embodiments, and so operation of the motor turns the magnet plate. The magnet plate in the impeller assembly is magnetically coupled through the vessel wall with the magnet plate in the motor assembly. This coupling results in the plate of the impeller assembly turning in conjunction with the plate of the motor assembly. The plate of the impeller assembly is directly connected to the impeller in particular embodiments, so that its motion is imparted to the impeller. The impeller pulls water in, from the tub/vessel, and exhausts it directly back into the tub/vessel.

The magnetic force of the magnets on the motor head assembly and the magnets on the impeller assembly housing, in addition to holding the two assemblies together through the wall of the tub, provide magnetic assistance to reduce the energy required to drive the system. The magnets in their respective plates, with their alternating polarities, allow the motor to drive the impeller assembly, and add to and complete the strong attraction between the two assemblies and secure them as an operating unit. They also provide a magnetic boost to the rotational motion through interaction with the mounting magnets, and thus reduce overall energy consumption.

The system is designed so that when the impeller assembly is removed from the inside of the tub/vessel the motor assembly, located on the exterior wall of the unit will automatically shut down. As previously indicated, a reed switch, Hall-effect device, or other hardware can be incorporated to interrupt the operating circuit(s) when the impeller assembly, or part of it, is removed from the inside of the tub.

The growth of bacteria within the pipes has led to this new system which eliminates the piping and replaces the jet with a removable impeller assembly that can be easily cleaned and disinfected by removing it from the spa or hydrotherapy system and submersing in an appropriate cleaning/disinfecting solution. Cleanliness and safety of the system are enhanced since there are no areas of standing water to collect bacteria or other agents between uses. In addition, the design eliminates apertures on the pedicure spa or tub by instead using magnetic force to couple the motor assembly to the impeller assembly. The system not only eliminates the potential for any leakage from the pedicure spa or hydrotherapy system but it also provides a smooth unencumbered acrylic surface for ease of cleaning and sanitation.

By alternating the north and south poles of the magnets in the magnet plates and placing them at a 45 degree angle to each other around the circumference of the magnet plate, an improvement in the performance of the motor and reduced energy consumption have been observed. The strength of the magnets in the magnet plate compared to the strength and location of the magnets on the periphery of the mounting plate and the impeller assembly have been found to provide the low energy performance of the assembled unit.

The circulation system can be positioned anywhere on the tub/vessel wall, based upon the interior characteristics of the tub in order to achieve optimized water flow for massage therapy. The system circulates water inside the tub or vessel and, in the case of a pedicure spa, around the user's feet. The design also allows air suction into the impeller assembly. This air is then blended into the water stream to aid in hydrotherapy. The aeration of water also reduces bacteria and algae growth by adding oxygen into the water. The whole assembly is small in size so that it can fit into tight spaces of the existing tubs, and can easily be retrofitted. In addition, the motor automatically shuts down when the cap is removed for cleaning, making the whole system safe. In some embodiments, a set of two or more impeller assemblies can be included in a kit with a motor assembly, so that when one impeller assembly is removed for cleaning, a second is attached to the motor assembly so that the pedicure spa or other device can continue in use during cleaning of the original impeller assembly.

In addition to the ease of removal of the impeller assembly, the motor unit can be easily removable for servicing. Since there are no holes required through the device wall, the unit is easily removed for maintenance should it be necessary.

The use of multi-directional magnets placed in strategic orientation within the coupling assemblies allows for the impeller assembly to have an ultra low profile. Such a profile satisfies aesthetic needs of the spa industry and allows it to fit into existing tubs and pedicure spas as original or retrofitted equipment.

DESCRIPTION OF ILLUSTRATED EMBODIMENTS

Figure 1:
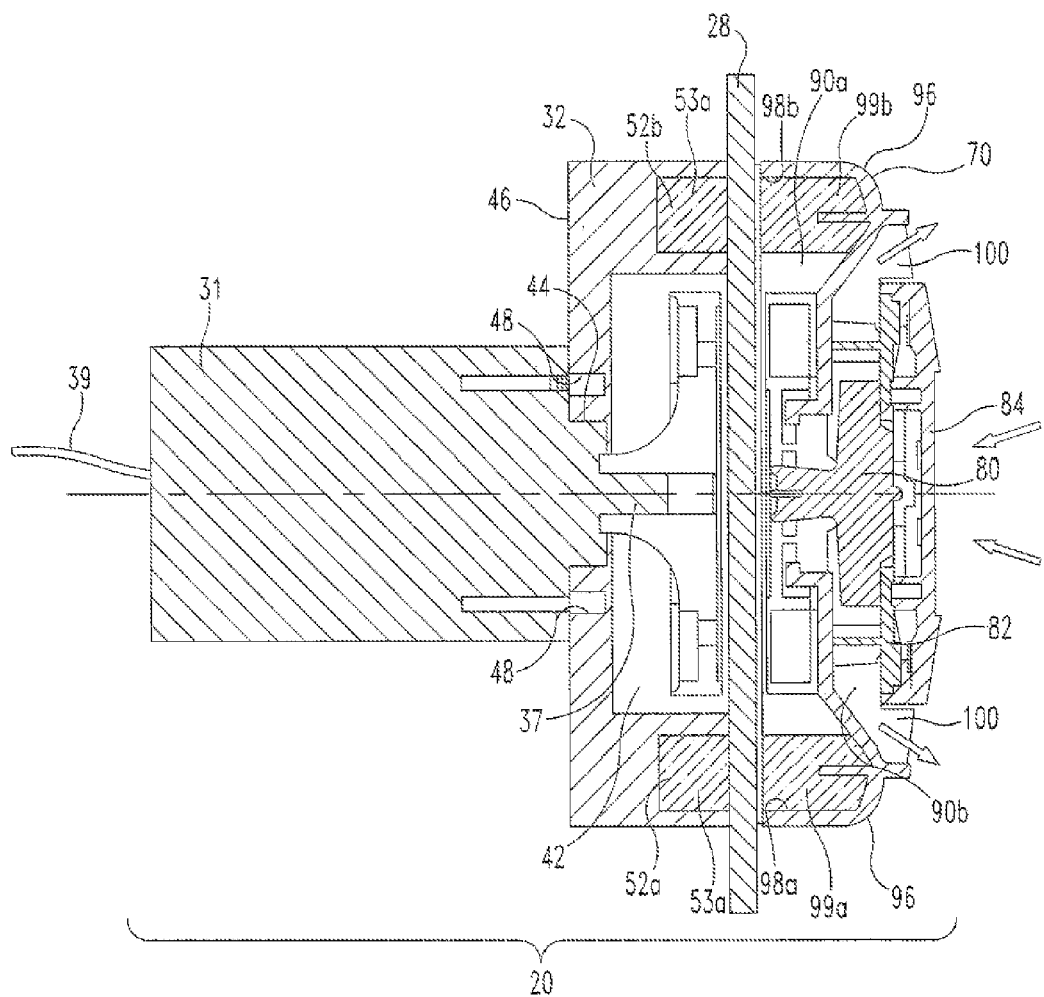
FIG. 1 is a cross-sectional view of the motor assembly, the wall and impeller assembly.

For the purposes of promoting an understanding of the principles of the disclosure, reference will now be made to the embodiments illustrated in the drawings and specific language will be used to describe the same. It will nevertheless be understood that no limitation of the scope of the claims is thereby intended, and alterations and modifications in the illustrated device, and further applications of the principles of the disclosure as illustrated therein are herein contemplated as would normally occur to one skilled in the art to which the disclosure relates.

In the following description, certain terms are used for convenience only and is not limiting. The words such as "inner", "outer", "inside", "outside" and "between" describe parts in the diagrams to which reference is made. Furthermore, the words "a" means that there is "at least one" object or part in the assemblies.

Figure 2:
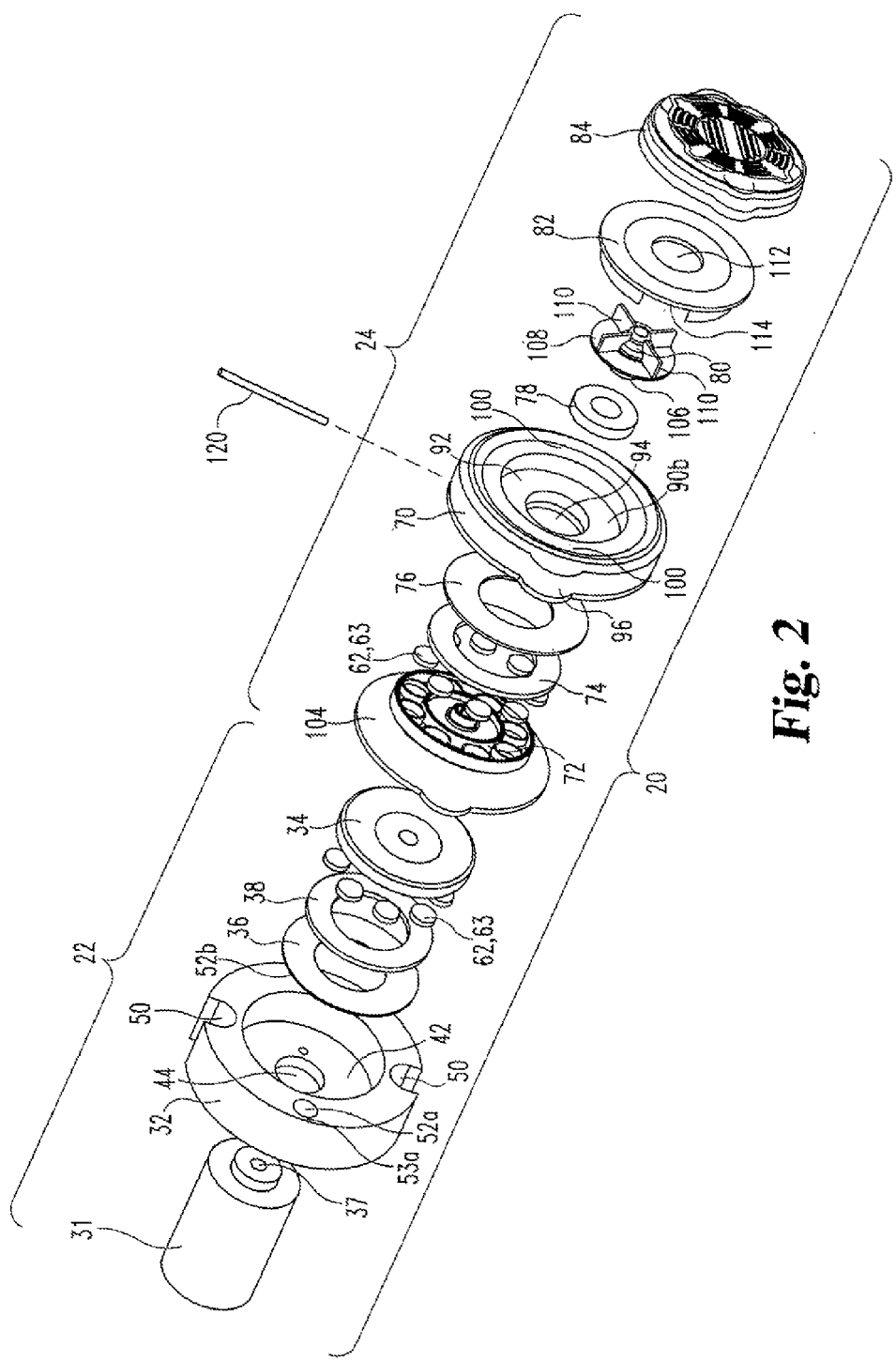
FIG. 2 is an exploded view of impeller and motor assemblies.

FIG. 1 illustrates a cross-sectional view of a circulation system 20 attached to a wall of a tub or other vessel. FIG. 2 is an exploded view of circulation system 20. In the illustrated embodiment, circulation system 20 includes a motor assembly 22 and an impeller assembly 24 which are aligned with each other through wall 28 of a tub or vessel. Motor assembly 22 includes a motor 31, a motor mounting or housing 32, and a first magnet plate 34 along with a backing plate 36 and a first washer 38. Motor 31 is a small DC motor in a particular embodiment, having a drive shaft 37 and is powered by an electric source (e.g. rechargeable battery or wall current) through electric wire 39.

Mounting 32 is a cover or housing for magnet plate 34, and so includes an internal space 42 for plate 34, backing plate 36 and washer 38. An opening 44 in the rearward surface 46 of mounting 32 allows at least a part of motor 31 to be inserted into mounting 32. In the illustrated embodiment, mounting 32 has two holes 48 on either side of opening 44 for dowels, bolts or other connecting members to make a secure connection between motor 31 and mounting 32. Mounting 32 also includes at least one gap or slot 50 (two open slots are shown in the illustrated embodiment) for accommodating a bracket (not shown) for stabilizing motor assembly 22 against wall 28. Mounting receptacles or openings 52a and 52b, which in the illustrated embodiment are cylindrical with a central axis parallel to the central axis of mounting 32, are also in the peripheral wall of mounting 32. Two mounting magnets 53a and 53b are provided, each inserted in a respective mounting receptacles or openings 52a, 52b. Mounting magnets 53a, 53b are neodymium magnets in a particular embodiment that are ½ inch in diameter and ¼ inch in length. Mounting magnets 53a, 53b are held within mounting receptacles or openings 52a, 52b by magnetic attraction to mounting 32, by interference fit, and/or by adhesives. Mounting magnets 53a, 53b are set with opposite polarity, that is, if mounting magnet 53a has a north pole facing out from mounting 32, then mounting magnet 53b has a south pole facing out from mounting 32. Mounting magnets 53a, 53b hold motor assembly 22 against wall 28 with impeller assembly 24 as illustrated in FIG. 1, as will be discussed further below.

Plate 34 in the illustrated embodiment is a circular disc having a central opening 60 for direct connection with motor 31. A set of eight equiangularly spaced rotational magnets 62, 63 (preferably also of neodymium) are positioned in a circular pattern at or near the periphery of the disc. Rotational magnets 62, 63 are attached to plate 34 by magnetic force, adhesives, or other ways of holding rotational magnets 62, 63 in place in plate 34. In particular embodiments, plate 34 may be fashioned with indentations or receptacles in which rotational magnets 62, 63 are placed, and may use an interference fit along with or instead of the holding methods noted above.

Figure 4:
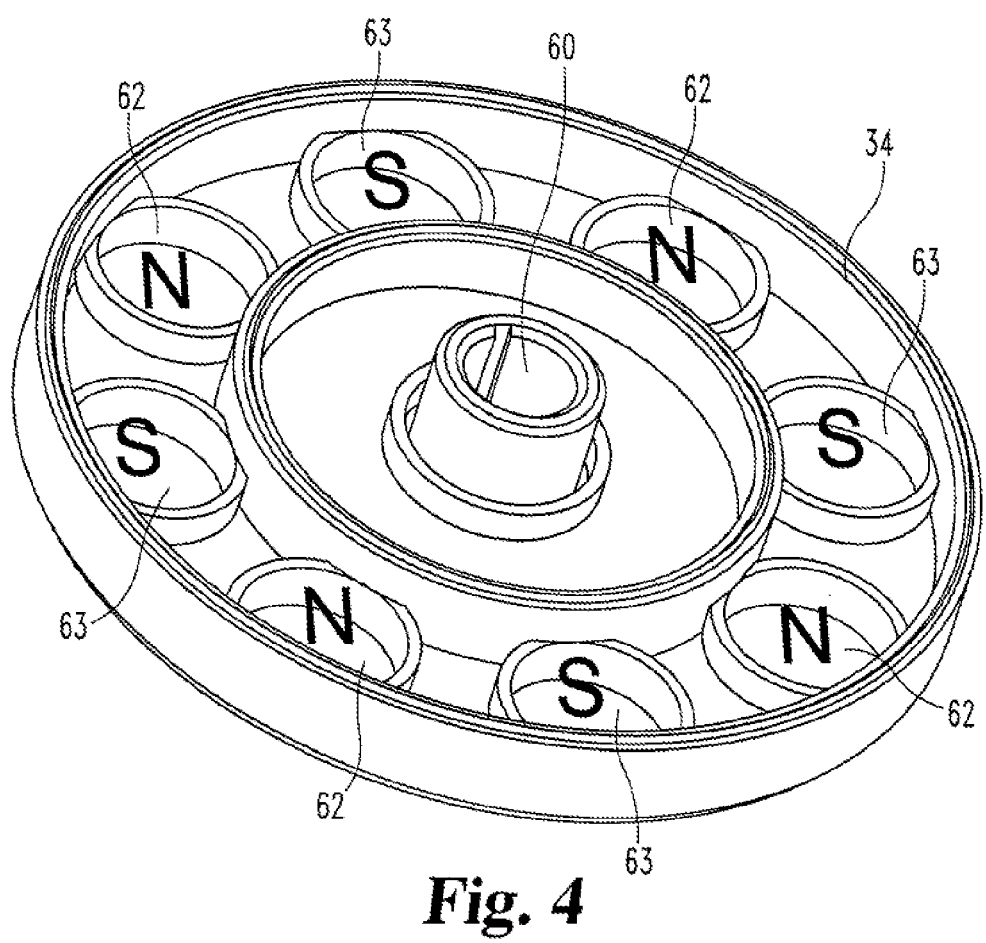
FIG. 4 is a front view of the magnetic drive plate showing the alternating polarity of the magnets.

In a particular embodiment, each of rotational magnets 62, 63 is in the form of a cylinder ⅜ inch in diameter and ⅜ inch in length, and neodymium magnets were chosen for their small volume and high magnetic force. Rotational magnets 62, 63 have polarities facing outward (i.e. as seen in FIG. 4) that alternate. For example, rotational magnets 62 have a north pole facing outward from plate 34, while rotational magnets 63 have a south pole facing outward from plate 34. As seen in FIG. 4, no neighboring magnets have the same polarity. With eight magnets equiangularly spaced as in the illustrated embodiment, the center of each rotational magnet 62, 63 is 45 degrees apart from the centers of its neighboring magnets. The magnetic poles (whether north faces outward or south) are parallel to the drive shaft 37 of motor 31, and thus perpendicular to the direction of rotation of drive shaft 37 and plate 34. As noted above, plate 34 is operatively associated with motor 31 (e.g. directly connected to drive shaft 37), rotating about an axis with a drive shaft.

Washer 38 is made of steel in a particular embodiment with a thickness of ⅜ inch. Washer 38 functions as a magnetic force multiplier, as the flux lines from the magnetic fields between the motor and impeller assemblies are concentrated through the steel. Washer 38 thus increases the coupling efficiency of circulation system 20, so that a very low profile of circulation system 20 can be maintained, aiding retrofitting of tubs and minimizing the space needed to use them. It will be understood that other ferromagnetic substances could be used for washer 38. Backing plate 36 lies atop washer 38 and either atop or within the periphery of plate 34. In particular embodiments, washer 38 and backing plate 36 are fixedly attached to plate 34 (either individually or as a group) so that washer 38 and rotational magnets 62, 63 remain in their designated locations with respect to plate 34.

With backing plate 36, washer 38, and rotational magnets 62, 63 attached to plate 34 as indicated, plate 34 is inserted into internal space 42 of mounting 32. Motor 31 is inserted into opening 44 of mounting 32, with drive shaft 37 being inserted into central opening 30 of plate 34. In the illustrated embodiment, drive shaft 37 is fixedly attached to plate 34 via mechanical, adhesive or other methods so that rotation of drive shaft 37 is transmitted directly to plate 34. Plate 34 maintains a clearance from the sides of mounting 32 in internal space 42 and its surface facing out from internal space 42 is below the level of the peripheral edge of mounting 32 around it, to prevent rubbing friction when plate 34 rotates.

The illustrated embodiment of impeller assembly 24 includes a mounting or housing 70, a second magnet plate 72, a second washer 74, a second backing or base plate 76, a thrust bearing 78, an impeller 80, an inner cap 82 and a front cover 84. Generally, plate 72 with its washer 74 and backing plate 76 are within one side of housing 70, and impeller 80, inner cap 82 and cover 84 are in or on the other side of housing 70.

Housing 70 includes an internal space 90, with magnet plate chamber or area 90a on one side for plate 72, washer 74 and backing plate 76, and part 90b on the other side, separated by a wall 92 with an opening 94. In the illustrated embodiment, housing 70 has a generally circular exterior edge with two bulges or ears 96. Each bulge 96 has a respective mounting receptacles or openings 98a, 98b, which in the illustrated embodiment are cylindrical with a central axis parallel to the central axis of housing 70. Two mounting magnets 99a, 99b are provided, each inserted in respective mounting receptacles or openings 98a, 98b. Mounting magnets 99a, 99b are substantially identical to mounting magnets 53a, 53b in a particular embodiment, and are held within mounting receptacles or openings 98a, 98b by magnetic attraction to mounting 70, by interference fit, mechanical holder and/or by adhesives. As with mounting magnets 53a, 53b, mounting magnets 99a, 99b are positioned with opposite polarities, and so that they hold motor assembly 22 against wall 28 with impeller assembly 24. Thus, if mounting magnet 53a has a north pole facing to the right as seen in FIG. 1, then mounting magnet 53b will have a south pole facing to the right. Magnet 99a will have a south pole and mounting magnet 99b will have a north pole each facing to the left as seen in FIG. 1, so that mounting magnets 99a and 53a attract and mounting magnets 99b and 53b attract. Housing 70 also includes two side channels 100 for allowing the passage of fluid out of impeller assembly 24, as will be discussed further below.

Plate 72, washer 74, and backing plate 76 are identical to plate 34, washer 38 and backing plate 36 described above, in the illustrated embodiment. A set of eight rotational magnets 62, 63 are placed in plate 72 around a central opening 60, just as discussed previously. On the outside of plate 72, an external cover or seal 104 is placed, which abuts wall 28 of a tub or vessel in use and inhibits or prevents water or other fluid from entering plate 72.

Thrust bearing 78 is positioned within or adjacent to opening 94 through housing 70, and supports impeller 80 and/or plate 72. Bearing 78 features glass balls (eight glass balls, in one embodiment) sufficient to tolerate the axial load applied to the shaft, so as to minimize the friction of rotation. The glass balls are placed in a circular ring divided with plastic spacers. Thrust bearing 78 is made from glass and plastic to eliminate observed problems of metallic parts, such as rusting or decomposition in a water (particularly salt-water) environment and interference with the magnetic fields of the magnets discussed above.

Impeller 80 includes a stem 106 extending from one side of a base 108 and one or more blades 110 on the other side of base 108. Stem 106 is generally perpendicular to base 108 and connects to opening 60 in plate 72 through thrust bearing 78. Stem 106 thus is along the axis of rotation of plate 72 and impeller 80. Blades 110 generally extend radially outward from the axis of rotation, and are configured to draw fluid in through inner cap 82 and cover 84 and force it outward through channels 100. Impeller 80 also provides suction for drawing air into housing 70, as will be discussed below.

Figure 3:
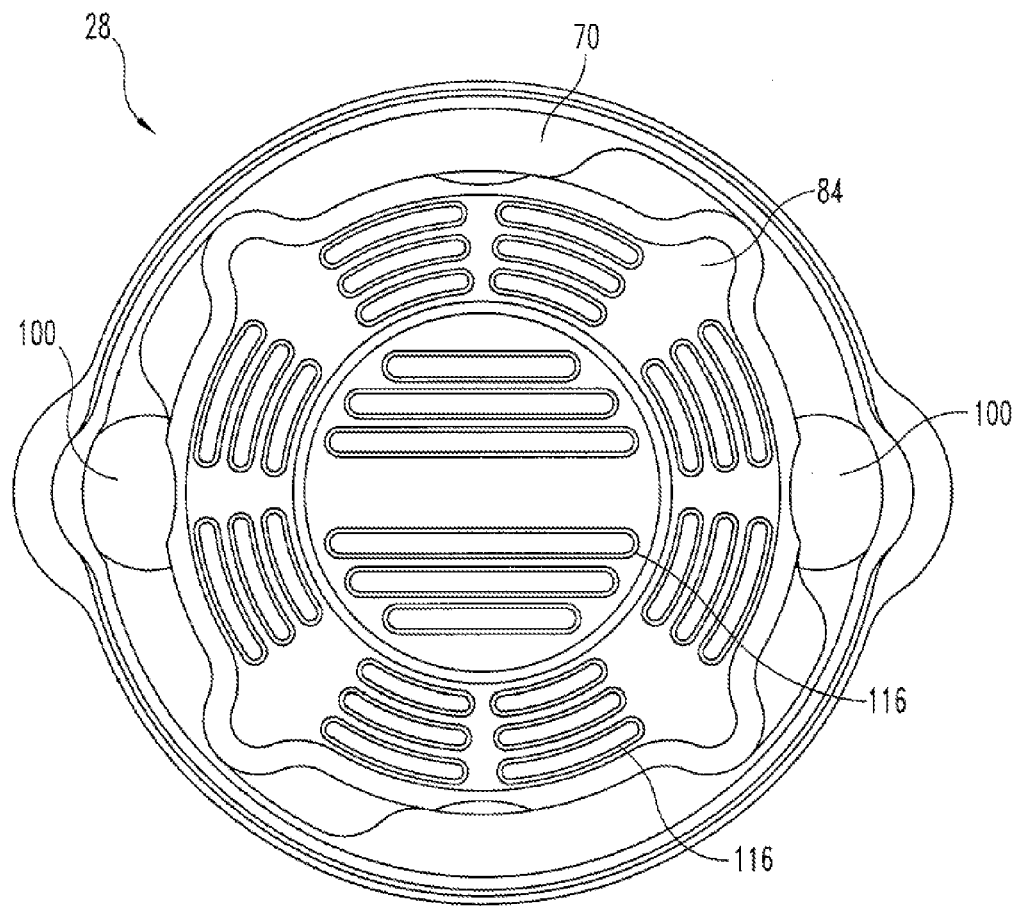
FIG. 3 is front view of the impeller assembly cap.

Inner cap 82 fits generally over and around impeller 80 within housing 70. Inner cap 82 remains stationary as impeller 80 rotates. Inner cap 82 includes a central opening 112 and one or more side openings 114. Fluid is generally drawn into housing 70 through opening 112 and is pushed by impeller 80 through side openings 114 into channels 100 of housing 70. Cover 84 contains one or more inlet ports 116 as seen in FIG. 3. Ports 116 may be straight, wavy, circular or other design that is aesthetically pleasing and allowing sufficient water throughput. Fluid flows through ports 116 toward impeller 80 and is then pushed to the periphery of impeller 80, channeled through the cavity in housing 70 toward channels 100 where it exits with sufficient pressure to form the water jets.

As indicated above, plate 72, washer 74 and backing plate 76 are assembled as discussed with respect to plate 34, washer 38 and backing plate 36. Cover or seal 104 covers the surface of plate 72 opposite from backing plate 76. Plate 72 is placed in magnet plate chamber or area 90a of housing 70 and joined to stem 106 of impeller 80 through thrust bearing 78. Thrust bearing 78 is preferably fixed within opening 94 of housing 70. Inner cap 82 and cover 84 are attached over impeller 80 to each other and/or to housing 70.

In use, motor assembly 22 assembled as noted above is placed against wall 28 of a tub or vessel on the outside of the tub or vessel, and impeller assembly 24 is placed against wall 28 on the inside of the tub or vessel. Mounting magnets 53a, 53b and 99a, 99b attract each other to hold motor assembly 22 and impeller assembly 24 together with wall 28 sandwiched between. In an appropriate assembled condition, the axis of rotation of plate 34 and plate 72 are aligned. If used, a bracket (e.g. an L-shaped bracket) glued or otherwise attached to mounting 32 via one or both of slots 50 is attached to the outside of wall 28 to brace motor assembly 22. When motor assembly 22 and impeller assembly 24 are magnetically held together by mounting magnets 53a, 53b and 99a, 99b, magnet plates 34 and 72 orient themselves so that their respective rotational magnets 62, 63 attract each other, adding to the hold of the assemblies to each other. When electrical power is provided to motor 31, drive shaft 37 begins to turn plate 34. Because of the magnetic attraction between the respective rotational magnets 62, 63 or plates 34 and 72, plate 72 begins to turn as well. Plate 72 turns impeller 80 drawing water in through cover 84 and inner cap 82 and forcing it out through channels 100.

As noted above, electronic hardware and software may be provided to control circulation system 20. For example, a reed switch or Hall-effect device may be connected into the operating circuitry providing power to motor 31. As long as mounting magnets 53a, 53b and 99a, 99b are attracting each other to keep assemblies 22 and 24 together, such a reed switch or Hall-effect device maintains the circuit closed, and if motor 31 is activated, circulation system 20 can run. However, when assemblies 22 and 24 are separated, as when impeller assembly 24 is removed for cleaning, the reed switch or Hall-effect device opens or otherwise disrupts the operating circuit, preventing further operation of circulation system 20 until an impeller assembly 24 is reattached. As another example, circuitry and software, including a keypad in one embodiment, can be connected to motor 31 so as to be able to program motor 31 to turn on or off at a certain time, or to increase or decrease revolutions of motor 31, plates 34 and 72, and impeller 80.

Circulation system 20 is able to operate at very low power as a result of the interaction between the "peripheral" magnets (mounting magnets 53a, 53b and 99a, 99b) and the "plate" magnets (rotational magnets 62, 63 of plates 34 and 72). While electrical power is needed to start plates 34 and 72 rotating and to maintain that rotation, the placement, size and orientation of the peripheral and plate magnets provide a rotational boost that keeps that power usage very low. Consider a pair of plate magnets, for example a magnet 62 on plate 34 that faces and attracts a rotational magnet 63 on plate 72. It has been found through experiment that as that pair of plate magnets or magnetic coupling approaches one of the sets of peripheral magnets (e.g. mounting magnets 53b and 99b) the pair of plate magnets is pulled toward that set of peripheral magnets, adding or maintaining speed of plates 34 and 72 and relieving burden on motor 31. On the other side of the system, as that pair of plate magnets passes the other set of peripheral magnets (mounting magnets 53a and 99a) the repulsion force adds or maintains speed. It has been found experimentally that the alternating polarity of rotational magnets 62, 63 in plates 34, 72, along with the strength and positioning of mounting magnets 53a, 53b and 99a, 99b with respect to rotational magnets 62, 63 is what provides such magnetic boost, and that in this way the operation of circulation system 20 can be maintained with about 0.1 horsepower or less in electrical power. It has been found experimentally that straight magnetic rings do not provide such boost, and other relative positions and strengths do not operate as well as the disclosed embodiments above.

A further feature that can be included with circulation system 20 is for aeration of the fluid in the tub or vessel. To that end, housing 70 can be prepared with an opening for an air drawing tube or snorkel 120 that extends from a point adjacent impeller 80 to a point above the level of the fluid in the tub or vessel. When impeller 80 turns and forces water out of housing 70 via channels 100, a lower pressure is created in the lower end of tube 120, so that air is drawn through air drawing tube 120. Air is thus added to the fluid being exhausted through channels 100, with the benefits of such aeration being realized by the user of circulation system 20.

It will be understood that a variety of tubs or vessels can use one or more circulation systems 20 at a time. A larger vessel (e.g. a hot tub) may use a number of circulation systems 20 in various locations around the vessel.

Figure 5:
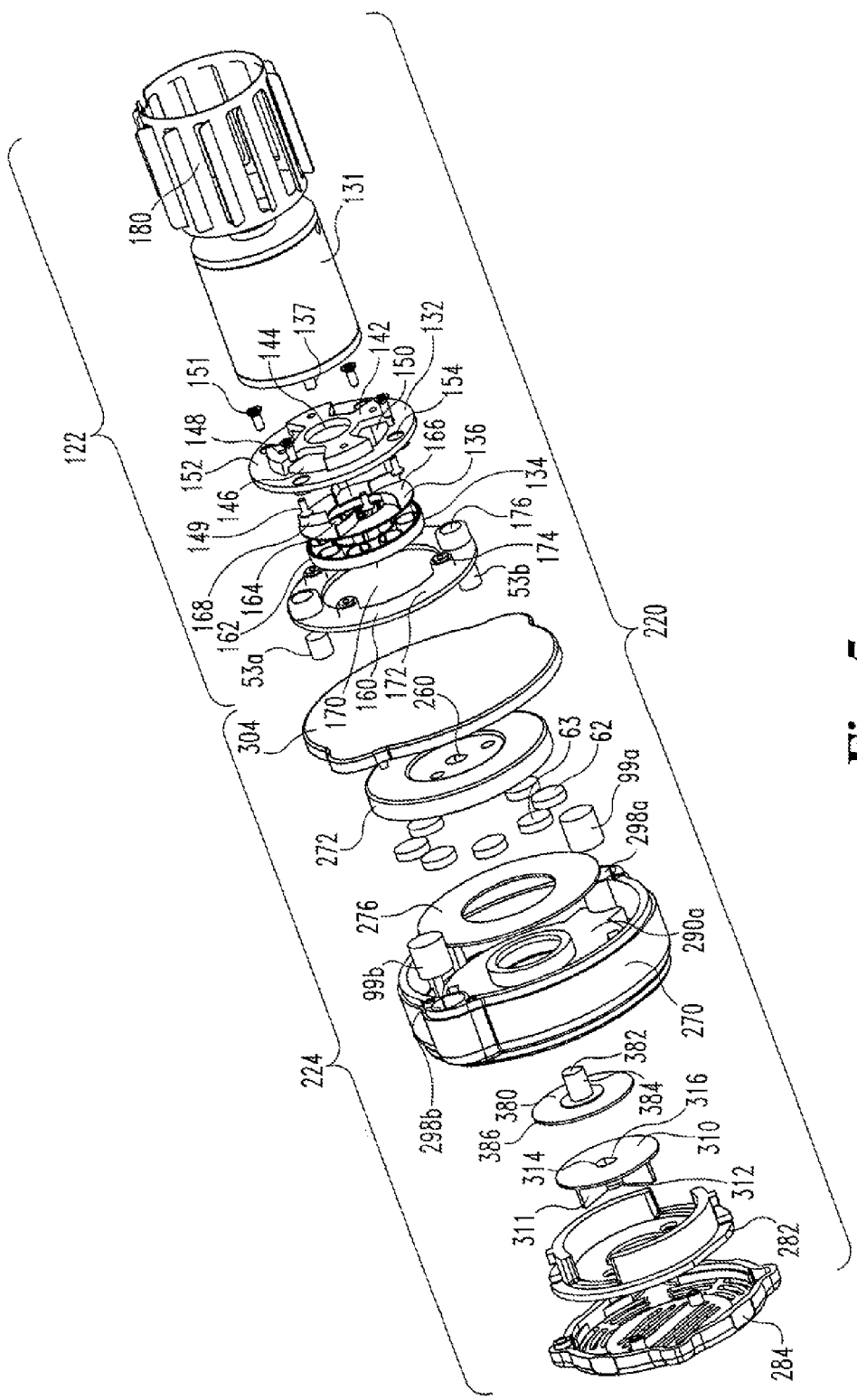
FIG. 5 is an exploded view of another embodiment of impeller and motor assemblies.
Figure 6:
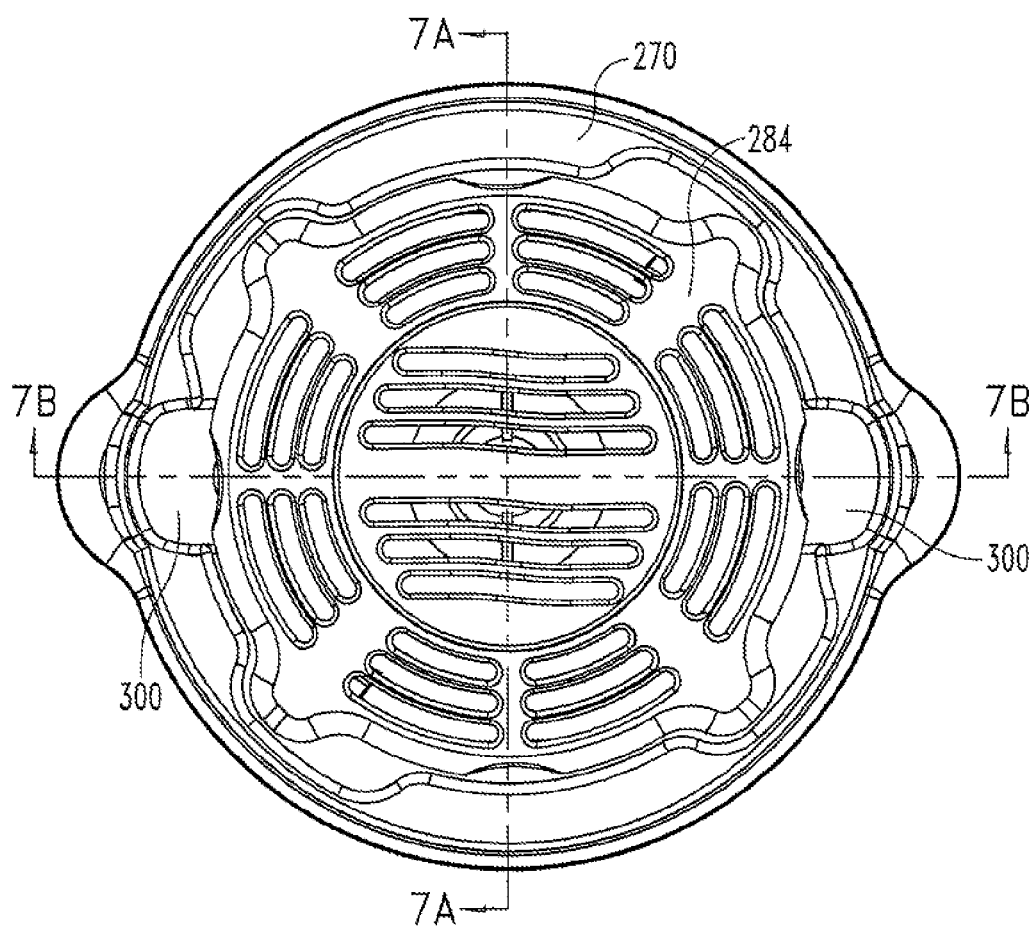
FIG. 6 is a front view of the FIG. 5 impeller assembly and the magnet plate and cover of the FIG. 5 motor assembly.

Another embodiment of a circulation system 220 is illustrated in FIG. 5 in an exploded view. In the illustrated embodiment, system 220 includes a motor assembly 122 and an impeller assembly 224 which are aligned with each other through a wall of a tub or vessel. FIGS. 6 and 7 illustrate cross-sectional views of the circulation system 220.

Figure 8:
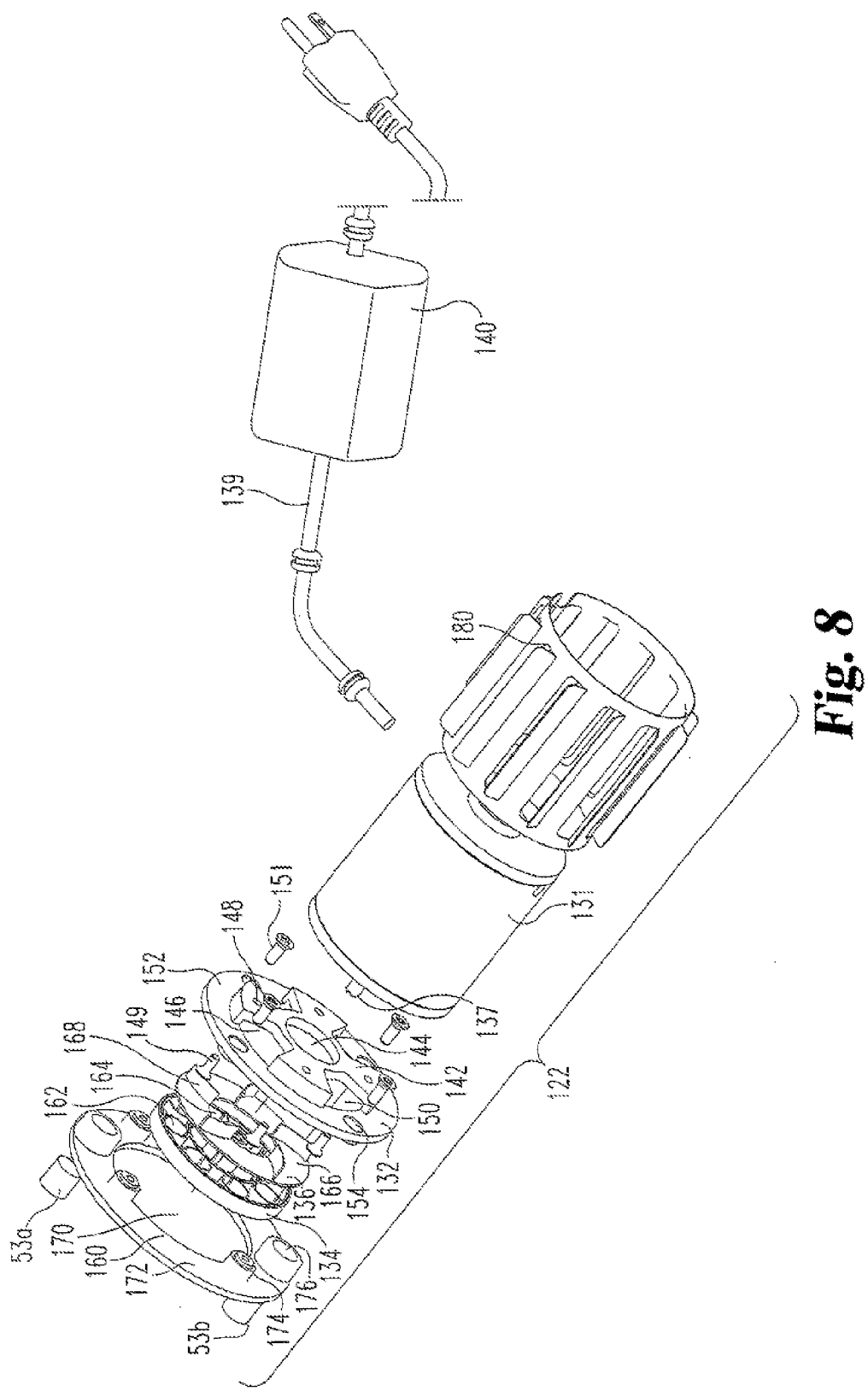
FIG. 8 is an exploded view of the FIG. 5 motor assembly.
Figure 9:
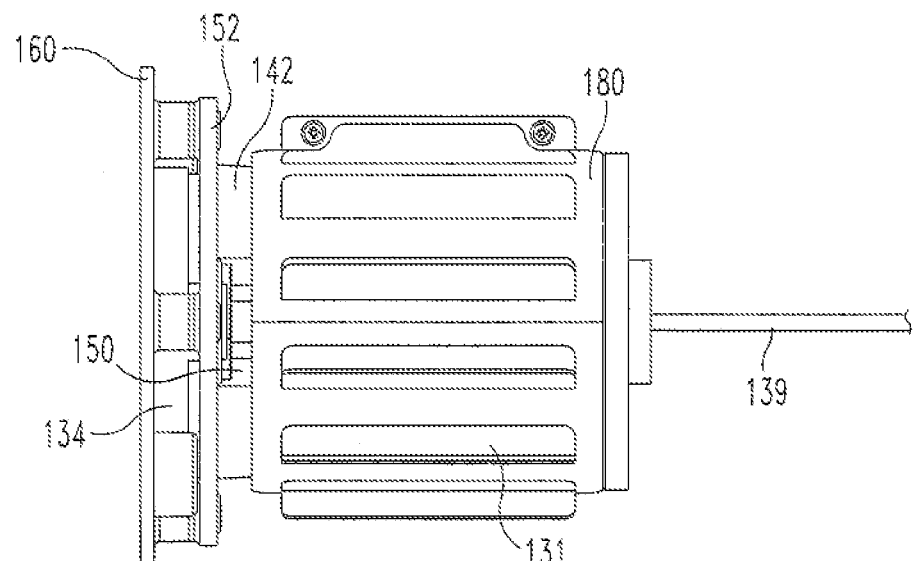
FIG. 9 is a side view of the FIG. 8 embodiment assembled.
Figure 10:
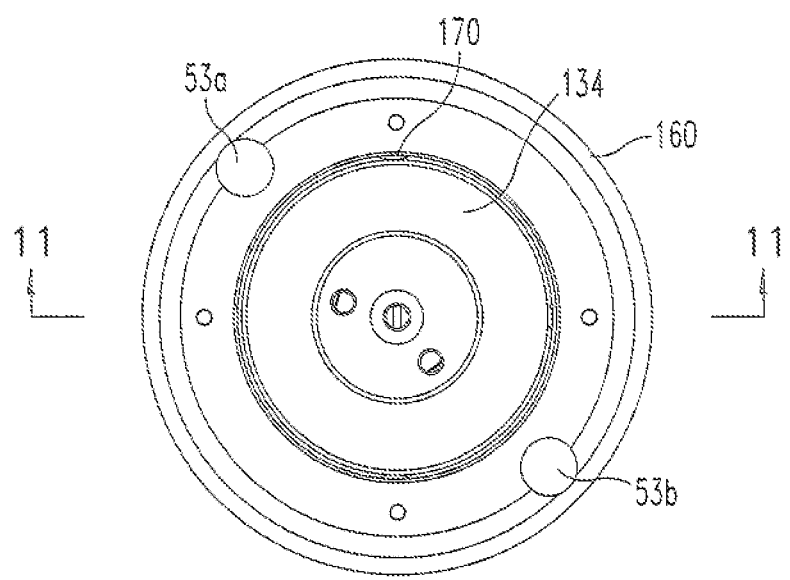
FIG. 10 is a front end view of the FIG. 9 embodiment.
Figure 11:
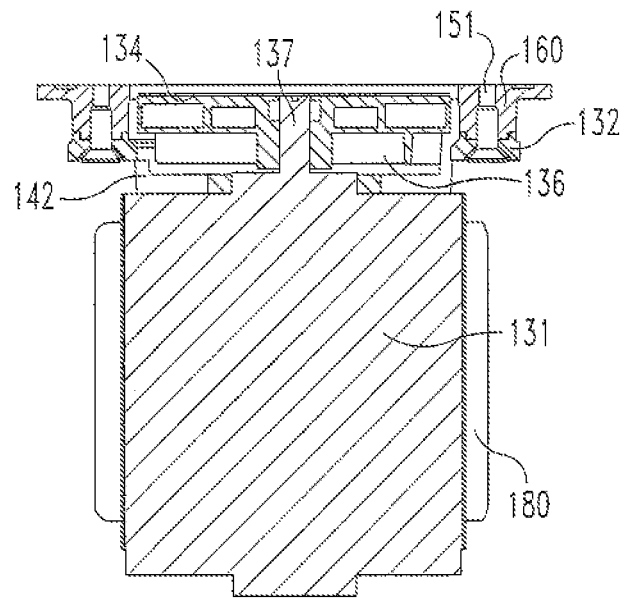
FIG. 11 is a cross-sectional view of the FIG. 10 embodiment.
Figure 12:
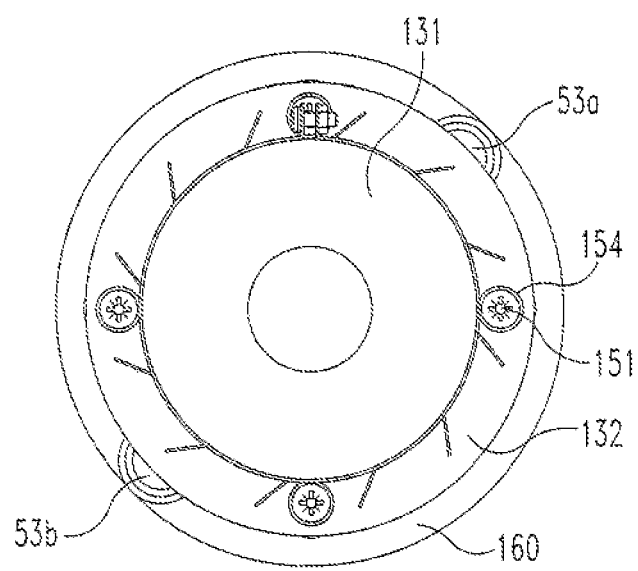
FIG. 12 is an end view of the FIG. 8 embodiment.

Motor assembly 122 is illustrated in FIG. 8 in an exploded view and as assembled in FIGS. 9, 10, 11, and 12. Motor assembly 122 is similar to motor assembly 22. Motor assembly 122 includes a motor 131, a motor mounting or housing 132, a first magnet plate 134, and a backing plate 136. Motor 131 is a small DC motor in a particular embodiment, having a drive shaft 137 and is powered by an electric source (e.g. rechargeable battery or wall current) through electric wire 139. In some embodiments, wire 139 includes a circuit box 140. In some forms, one or more mounting grommets are positioned around electric wire 139. In the illustrated embodiment, motor assembly 122 includes a heat dissipater 180 with fins which encircles motor 131.

Mounting 132 forms a housing for the first magnet plate 134, and includes an internal space 146 for backing plate 136 and magnet plate 134. An opening 144 in the rearward surface 142 of mounting 132 allows at least a part of motor 131 to be inserted into mounting 132. In the illustrated embodiment, mounting 132 has a plurality of holes 154 that are each sized to receive a screw or other fastener 151 to attach the mounting 132 to an outer ring 160 as described in more detail below. The rearward surface 142 of mounting 132 includes a plurality of holes 148 sized to receive a screw, bolt, dowels, or other connector 149 to make a secure connection between the motor 131 and the mounting 132. The rearward surface 142 of mounting 132 also defines a plurality of openings 150 that allows dissipation of heat produced by motor 131.

Mounting 132 includes a rim 152 that is sized to rest against and partially cover a pair of magnet receptacles or indentations in outer ring 160 when mounting 132 is assembled with the outer ring 160.

Magnet plate 134 is similar to plate 34 discussed previously. Similarly to plate 34, a set of eight equiangularly spaced magnets (not illustrated) (preferably of neodymium) are positioned in a circular pattern at or near the periphery of magnet plate 134. In the illustrated embodiment, magnet plate 134 includes a plurality of indentations or receptacles 162 that are positioned in a circular pattern and each of receptacles 162 is sized to receive one of the eight magnets.

Backing plate 136 is a disc shape with a central opening 164 that is sized to allow drive shaft 137 of motor 131 to connect to magnet plate 134. Backing plate 136 includes a rim 166 having a plurality of blades 168. Rim 166 is sized to cover the set of eight equiangularly spaced rotational magnets 62, 63 positioned in indentations or receptacles 162 of magnet plate 134. Arcuate blades 168 extend radially outward from the central opening 164. Each of blades 168 has a depth that is similar to the depth of depression or recess 146 of mounting 132.

Outer ring 160 is a disc shape with a central opening 170 that is sized to receive the outer diameter of magnet plate 134. Outer ring 160 includes a rim 172 having a plurality of projections 174 wherein each of projections 174 is configured to receive a fastener 151 to attach mounting 132 to the outer ring 160 and to assemble the magnet plate 134 and backing plate 136 there between. Rim 172 includes a plurality of projections 174 that corresponds with the plurality of holes 154 on mounting plate 132. Rim 172 also includes a pair of openings 176 that are sized to receive mounting magnets 53a, 53b. When outer ring 160 is assembled with magnet plate 134, rim 152 is held against and partially covers the openings 176 to prevent the mounting magnets 53a, 53b from falling out of the openings 176.

Impeller assembly 224 (see FIGS. 5-7) includes a mounting or housing 270, a second magnet plate 272, a second backing or base plate 276, an impeller 380, an impeller top 310, an inner cap 282, and a front cover 284. Generally, magnet plate 272 with its second backing plate 276 are on one side of housing 270, and impeller 380, impeller top 310, inner cap 282, and front cover 284 are on the other side of housing 270.

Housing 270 is substantially identical to housing 70. Two mounting magnets 99a, 99b are provided, each inserted into a respective one of openings 298a and 298b. Housing 270 also includes two side channels 300 for allowing passage of fluid out of the impeller assembly 224.

Plate 272 is similar to plate 72 as described above. However, plate 272 includes a central opening 260 for direct connection with the stem 382 of impeller 380 as described in more detail below. Opening 260 in magnet plate 272 is sized and shaped to receive the stem 382 of impeller 180. In one form, opening 250 is non-circular cross-sectional shape. In the illustrated embodiment, opening 260 has a circular shape with a flat edge.

A set of eight rotational magnets 62, 63 are placed in plate 272 around the central opening 260. Second backing plate 276 is positioned between the plate 272 to cover rotational magnets 62, 63. Second backing plate 276 is the same as backing plate 76. The plate 272, the set of eight rotational magnets 62, 63, and the second backing plate 276 are positioned within an open area on the rear of housing 270. On the outside of housing 270, an external cover or seal 304 is placed to enclose magnet plate 272 with housing 270. The rear side of cover 304 is designed to closely abut a wall of a tub or vessel in use. Second backing plate 276 is similar to backing plate 76.

Figure 13:
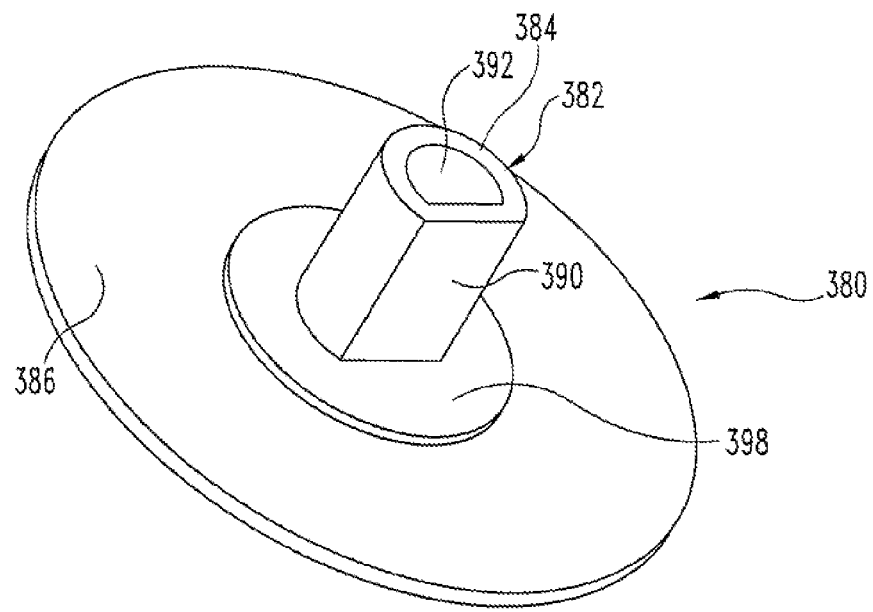
FIG. 13 is a front perspective view of the FIG. 5 impeller.
Figure 14:
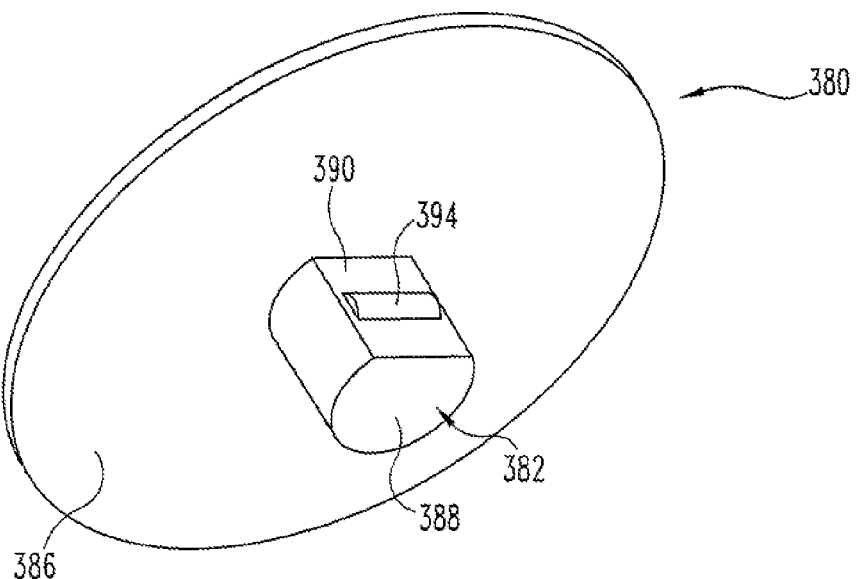
FIG. 14 is a rear perspective view of the FIG. 13 embodiment.

One embodiment of an impeller 380 is illustrated in FIGS. 13 and 14. Impeller 380 includes a stem 382 having a first portion 384 that extends rearward from one side of a base plate 386 and a second portion 388 that extends forward from the other side of the base plate 386. Stem 382 is generally perpendicular to base plate 386 and is along the axis of rotation of plate 272 and impeller 380. Stem 382 is cylindrically shaped with a substantially flat edge 390. Stem 382 further defines an opening 392 that tapers by about 2° from first portion 384 to second portion 388. First portion 384 is sized and shaped to be received in and to connect with the opening 260 in plate 272. In one embodiment, stem 382 has a length of about 18 millimeters and first portion 384 has a diameter of about 7.8 millimeters if the stem 382 were circular. However, the flat edge 390 reduces the outside width of the first portion 384 to about 7 millimeters and the width of the opening 392 to about 4 millimeters. The second portion 388 includes a protrusion 394. In the illustrated embodiment, protrusion 394 has a radius of about 1.2 millimeters and is located at about 4 millimeters from the base plate 386. In this embodiment, base plate 386 has a diameter of about 39 millimeters. The base plate 386 can include a circular lip 398 that extends around the first portion 384. The illustrated embodiment includes the circular lip 398 having a diameter of about 16.5 millimeters and a height of about 0.5 millimeters.

Figure 15:
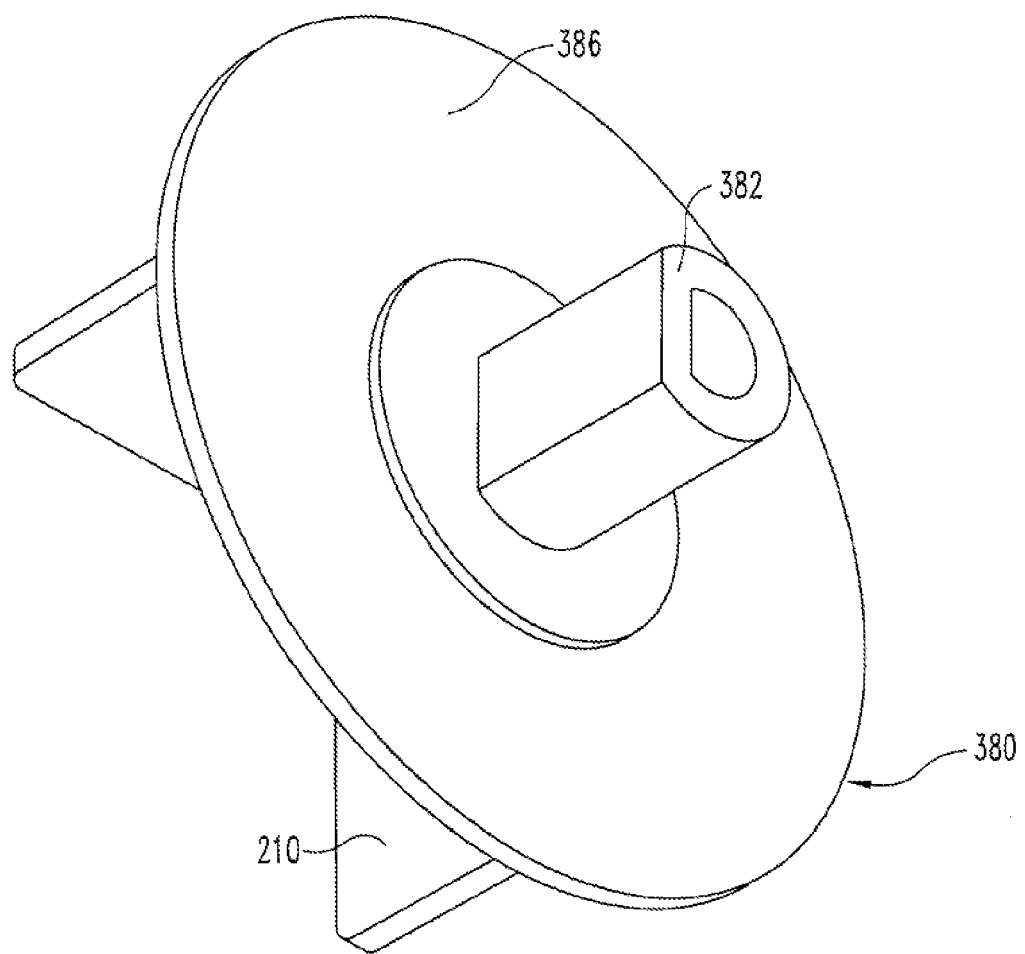
FIG. 15 is a front perspective view of the FIG. 14 embodiment with one or more blades assembled therewith.
Figure 16:
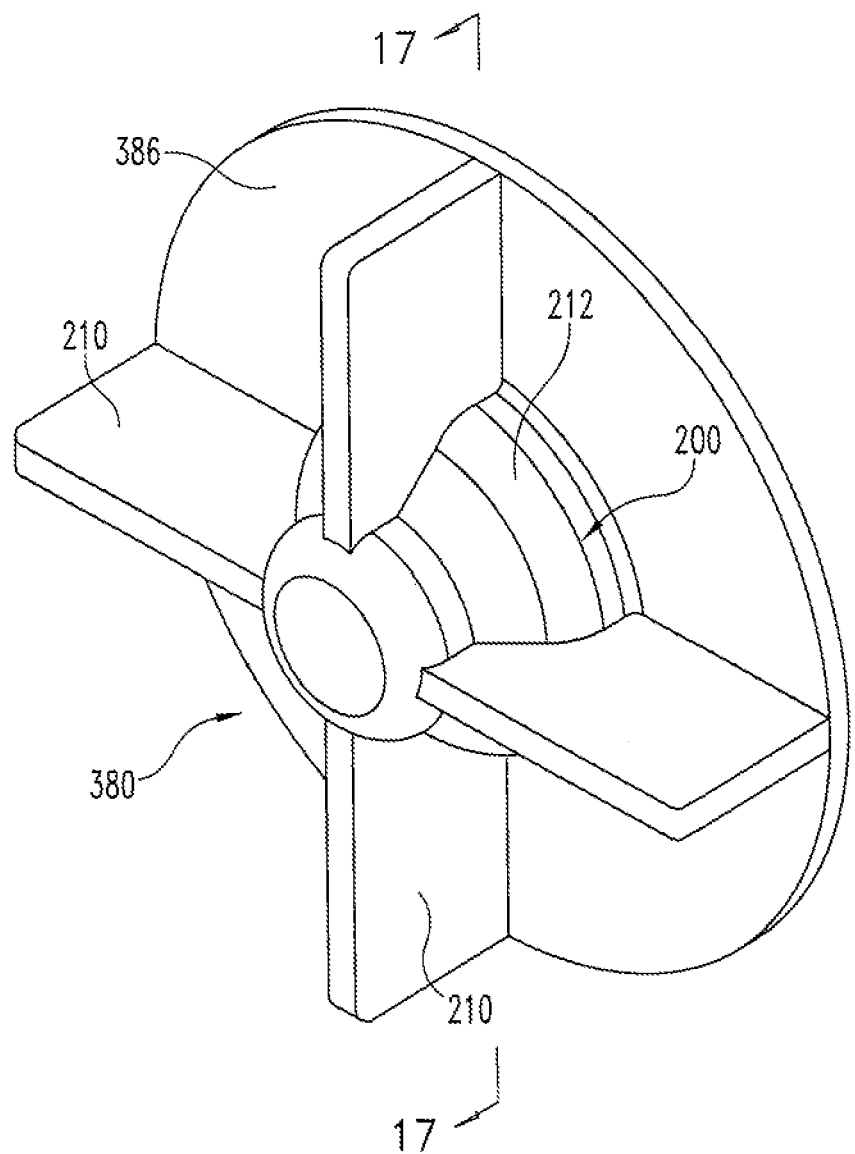
FIG. 16 is a rear perspective view of the FIG. 15 embodiment.
Figure 17:
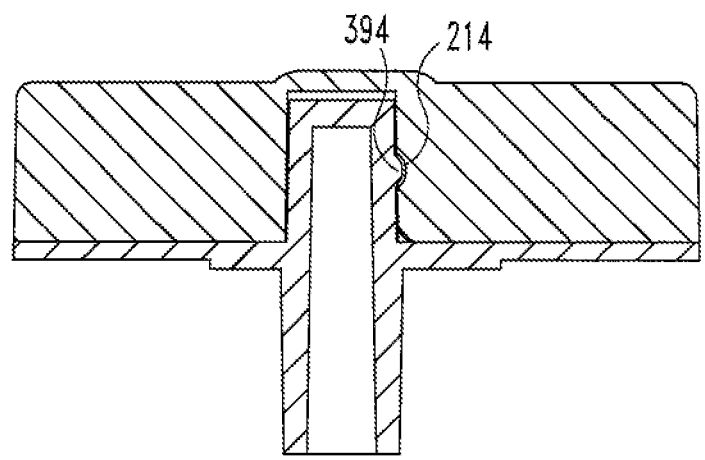
FIG. 17 is a cross-sectional view the FIG. 16 embodiment.

Illustrated in FIGS. 15, 16, and 17 is an impeller top 200 mounted on the forward side of impeller 380. Impeller top 200 includes one or more blades 210 extending from a hub 212. Blades 210 generally extend radially outward from the axis of rotation, and are configured to draw fluid in through inner cap 282 and front cover 284 and force it outward through channels 300 in housing 270. The rear of hub 212 includes a cylindrical opening with a flat portion (not illustrated) wherein the cylindrical opening and flat portion are sized to receive and mate with second portion 188 and flat edge 190. In the illustrated embodiment, the flat portion on the interior of cap 212 includes a groove 214 sized to receive protrusion 194 when impeller top 200 is mounted on second portion 188 of impeller 180. In one form, the protrusion 194 has a radius of about 0.048 millimeters and the groove 214 has a radius of about 0.049 millimeters. The nesting of protrusion 194 with groove 214 and the interaction of the flat portion in the interior of cap 212 with the flat edge 190 assists in maintaining the impeller top 200 on impeller 180.

Figure 7A:
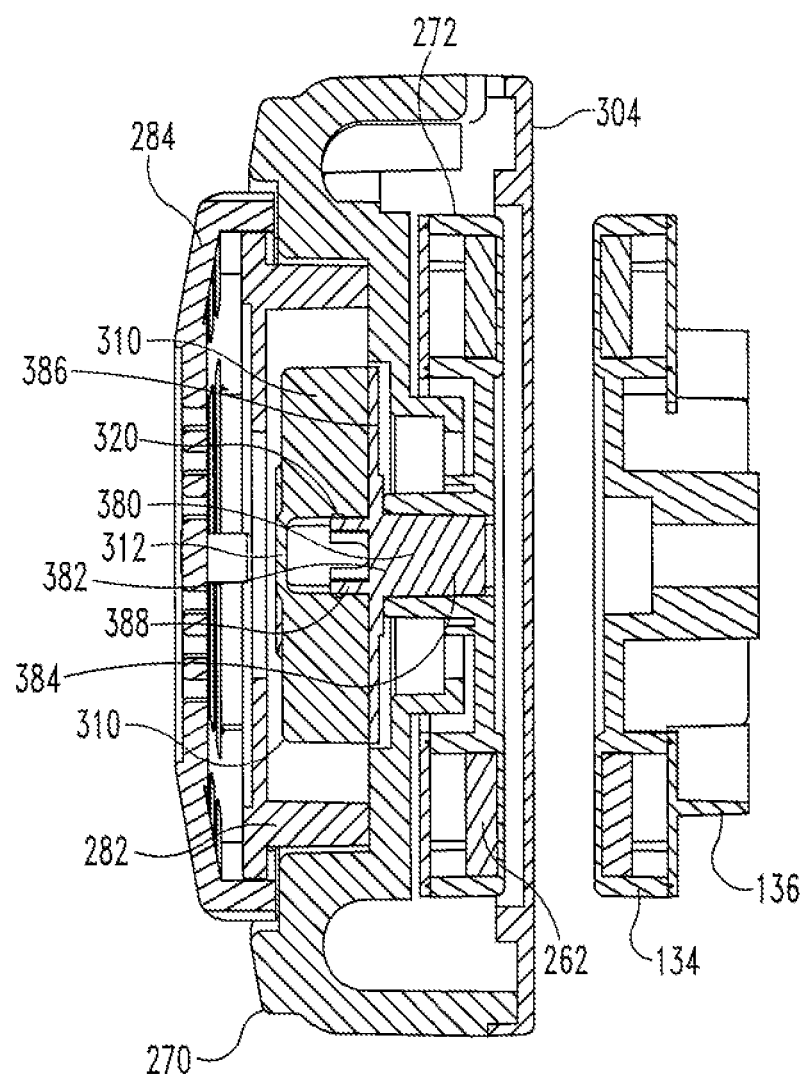
FIG. 7A is a cross-sectional view of the FIG. 6 embodiment.
Figure 7B:
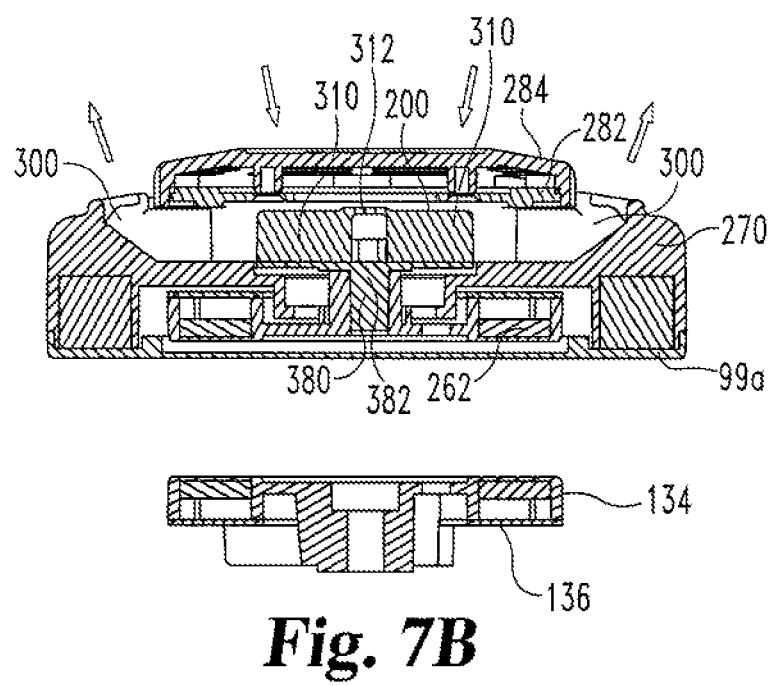
FIG. 7B is another cross-sectional view of the FIG. 6 embodiment.

An alternate version of impeller 380 and impeller top 310 are illustrated in FIGS. 7a and 7b. Impeller 380 includes a stem 382 having a first portion 384 that extends from one side of a base plate 386 like impeller 180. However, impeller 380 includes a stem with a pair of tabs 388 that extend from the opposite side of base plate 386. Pair of tabs 388 are configured to resiliently slightly flex inward to facilitate insertion into impeller top 310.

Impeller top 310 is similar to impeller top 200. Impeller top 310 includes one or more blades 311 that extend from a hub 312. The interior of hub 312 includes a cylindrical opening 314 with a flat portion 316 wherein the cylindrical opening 314 and flat portion 316 are sized and configured to receive the pair of tabs 366. In one embodiment, the interior of hub 312 includes one or more grooves 320 that are sized to receive and retain the pair of tabs 388 when impeller top 310 is mounted on impeller 380. In alternate embodiments, the one or more grooves 320 include one or more groove portions or is a continuous groove.

As shown in FIGS. 6 and 7, inner cap 282 fits generally over and around impeller 180 and impeller top 200 within housing 270. Inner cap 282 is similar to inner cap 82 as described above. Front cover 284 is similar to cover 84 and contains one or more inlet ports. Fluid is drawn inward through the central ports toward impeller top 200 and impeller 180 and is then pushed to the periphery of the impeller 180, channeled through the cavity in housing 270 towards channels where it exits with sufficient pressure to form the water jets.

The assembly of plate 272 and second backing plate 276 is located in area 290a within housing 270. Cover 304 encloses plate 272 within housing 270. Plate 272 is joined to stem 382 placing impeller 380 on the outer side of housing 270. Inner cap 282 and front cover 284 are attached over impeller top 310.

In use, motor assembly 122, assembled as noted above, is placed against a wall of a tub, vessel, or container on the outside (non-water side) of the tub or container, and impeller assembly 224 is placed against a wall on the inside of the tub or container. Mounting magnets 53*a*, 53*b* and mounting magnets 99*a*, 99*b* attract each other to align and hold the motor assembly 122 and impeller assembly 224 together with the wall sandwiched between. In assembled condition, the axis of rotation of plate 134 and plate 272 are aligned. When motor assembly 122 and impeller assembly 224 are magnetically held together by mounting magnets 53*a*, 53*b* and mounting magnets 99*a*, 99*b*, plate 134 and plate 172 orient themselves so their respective alternating rotational magnets 62, 63 attract each other, adding to the hold of the assemblies to each other. When electrical power is provided to motor 131, shaft 137 begins to turn plate 134. Because of the magnetic attraction between the respective rotational magnets 62, 63 or plates 134, 272, plate 272 begins to turn as well. Plate 272 turns impeller 380 and impeller top 310, drawing water in through front cover 284 and inner cap 282 and forcing it out through the channels 300 in housing 270.

While the disclosure has been illustrated and described in detail in the drawings and foregoing description, the same is to be considered as illustrative and not restrictive in character, it being understood that only the preferred embodiment has been shown and described and that all changes and modifications that come within the spirit of the disclosure are desired to be protected.

What is claimed is:

1. A powered pipeless circulation system for a container configured to hold a fluid, the circulation system comprising:
   a motor mounting abutting a wall of the container;
   a motor assembly within the motor mounting and including a rotatable motor magnet plate;
   an impeller housing abutting the wall, wherein said impeller housing is aligned with said motor mounting to sandwich the wall between the mounting and the housing;
   at least a first mounting magnet associated with said motor mounting and at least a second mounting magnet associated with said impeller housing, wherein the first and second mounting magnets are arranged to hold the motor mounting and the impeller housing against the wall;
   an impeller assembly including an impeller magnet plate rotatably mounted within a rearward open area of the housing and nested between the housing and the wall, wherein the impeller magnet plate is aligned to magnetically engage with the motor magnet plate;
   wherein the housing defines a forward open area and defines a central passageway from the forward open area to the rearward open area; and,
   wherein the impeller assembly includes a base plate having a diameter larger than said central passageway, wherein the base plate is rotatably mounted within the forward open area of the housing, and wherein a stem extends from a rear side of the base plate through said central passageway to connect to the impeller magnet plate, and wherein the impeller assembly includes a plurality of impeller blades extending forward from said base plate;
   a first plurality of rotational magnets arranged on the motor magnet plate in a pattern in an alternating polarity order;
   a second plurality of rotational magnets arranged in a complementary pattern to the first plurality of rotational magnets, and located on the impeller magnet plate in an alternating polarity order such the polarities of the first plurality of rotational magnets are magnetically attracted to the polarities of the second plurality of rotational magnets, and wherein the rotational magnets are arranged to form magnetic couplings through the container wall such that rotation of the motor magnet plate causes rotation of the impeller magnet plate; and,
   wherein the placement, the size, and the orientation of the first and second mounting magnets assert an attractive force on alternating paired couplings of the rotational magnets as they rotate towards the mounting magnets during rotation of the motor magnet plate and the impeller magnet plate, and wherein the first and second mounting magnets assert a repulsive force on alternating paired couplings of the rotational magnets as they rotate past the mounting magnets, and
   wherein each of the rotational magnets is disposed within outer ends defining a thickness of the corresponding first and second mounting magnets, the thickness being parallel to a rotational axis of the impeller magnet plate, and the first and second mounting magnets are set with opposite polarity.

2. The circulation system of claim 1, wherein the plurality of first rotational magnets and the plurality of second rotational magnets each includes eight magnets equiangularly spaced in said patterns.

3. The circulation system of claim 2, wherein the first plurality of rotational magnets are equiangularly arranged in 45 degree increments around the circumference of the motor magnet plate, and wherein the second plurality of rotational magnets are equiangularly arranged at 45 degree increments around the circumference of the impeller magnet plate.

4. The circulation system of claim 1, comprising an external cover arranged between the impeller housing and the wall and sized to enclose the impeller magnet plate within the housing.

5. The circulation system of claim 1, wherein the first mounting magnet is embedded within the motor mounting; and wherein the second mounting magnet is embedded within the impeller housing.

6. The circulation system of claim 1, comprising:
   an air drawing tube having a first end opposite a second end, the first end positioned above a level of fluid in the container and the second end configured to fit into the housing to allow air to be drawn into the housing adjacent the impeller assembly.

7. A powered pipeless circulation system for a container configured to hold a fluid, the circulation system comprising:
   a motor mounting abutting a wall of the container;
   a motor assembly within the motor mounting and including a rotatable motor magnet plate;
   a first plurality of rotational magnets arranged in a circular pattern on the motor magnet plate in an alternating polarity order;
   an impeller housing abutting the wall of the container and aligned with said motor mounting to sandwich the wall between the mounting and the housing;
   an impeller magnet plate rotatably mounted within said housing and nested in an open area defined between the housing and the wall;
   a second plurality of rotational magnets arranged in a circular pattern on the impeller magnet plate in an alternating polarity order;
   wherein the first plurality of rotational magnets are magnetically attracted to the second plurality of rotational magnets to form magnetically paired couplings through the wall such that rotation of the motor magnet plate causes rotation of the impeller magnet plate;
   at least a first mounting magnet embedded within said motor mounting and at least a second mounting magnet embedded within said impeller housing, wherein the first and second mounting magnets are arranged to hold the motor mounting and the impeller housing against the wall; and, wherein the placement, the size, and the orientation of the first and second mounting magnets assert an attractive force on alternating paired couplings of the rotational magnets as they rotate towards the mounting magnets during rotation of the motor magnet plate and the impeller magnet plate, and wherein the first and second mounting magnets assert a repulsive force on alternating paired couplings of the rotational magnets as they rotate past the mounting magnets, and wherein each of the rotational magnets is disposed within outer ends defining a thickness of the corresponding first and second mounting magnets, the thickness being parallel to a rotational axis of the impeller magnet plate, and the first and second mounting magnets are set with opposite polarity.

8. The circulation system of claim 7, wherein the motor magnet plate includes a plurality of receptacles sized to receive the first plurality of rotational magnets, and the impeller magnet plate includes a plurality of receptacles sized to receive the second plurality of rotational magnets.

9. The circulation system of claim 8, wherein the first plurality of rotational magnets are equiangularly arranged in 45 degree increments around the circumference of the motor magnet plate, and the second plurality of rotational magnets are equiangularly arranged at 45 degree increments around the circumference of the impeller magnet plate.

10. The circulation system of claim 7, wherein the housing defines a rearward open area and wherein the impeller magnet plate is within the rearward open area and nested between the housing and the wall.

11. The circulation system of claim 10, wherein the housing defines a forward open area and defines a central passageway from the forward open area to the rearward open area, wherein the impeller includes a base plate having a diameter larger than said central passageway, wherein the diameter is within the forward open area of the housing, and wherein a stem extends from a rear side of the base plate through said central passageway to connect to the impeller magnet plate; and wherein a plurality of impeller blades extends forward from said base plate.

12. The circulation system of claim 11, wherein the impeller magnet plate defines an opening to matingly receive the stem extending from the impeller base plate.

13. The circulation system of claim 12, wherein:
the opening in the impeller magnet plate and the stem have a noncircular cross sectional shape.

14. The circulation system of claim 13, wherein:
the noncircular cross sectional shape of the stem and opening is circular with a substantially flat portion.

15. A powered pipe less circulation system for a container configured to hold a fluid, the circulation system comprising:
a motor mounting abutting a wall of the container;
a motor assembly within the motor mounting and including a rotatable motor magnet plate;
a first plurality of rotational magnets arranged in a circular pattern on the motor magnet plate in an alternating polarity order;
an impeller housing abutting the wall of the container and aligned with said motor mounting to sandwich the wall between the mounting and the housing;
an impeller magnet plate rotatably mounted within said housing and nested in an open area defined between the housing and the wall;
a second plurality of rotational magnets arranged in a circular pattern on the impeller magnet plate in an alternating polarity order;
wherein the first plurality of rotational magnets are magnetically attracted to the second plurality of rotational magnets to form magnetically paired couplings through the wall such that rotation of the motor magnet plate causes rotation of the impeller magnet plate;
wherein the housing defines a forward open area and a rearward open area and defines a central passageway from the forward open area to the rearward open area; and,
wherein the impeller assembly includes a base plate having a diameter larger than said central passageway, wherein the base plate is nested within the forward open area of the housing, and wherein a stem extends from a rear side of the base plate through said central passageway to connect to the impeller magnet plate, and wherein the impeller assembly includes a plurality of impeller blades extending forward from said base plate, and
at least a first mounting magnet embedded within said motor mounting and at least a second mounting magnet embedded within said impeller housing, wherein the first and second mounting magnets are arranged to hold the motor mounting and the impeller housing against the wall;
wherein the placement, the size, and the orientation of the first and second mounting magnets assert an attractive force on alternating paired couplings of the rotational magnets as they rotate towards the mounting magnets during rotation of the motor magnet plate and the impeller magnet plate, and wherein the first and second mounting magnets assert a repulsive force on alternating paired couplings of the rotational magnets as they rotate past the mounting magnets, and
wherein each of the rotational magnets is disposed within outer ends defining a thickness of the corresponding first and second mounting magnets, the thickness being parallel to a rotational axis of the impeller magnet plate, and the first and second mounting magnets are set with opposite polarity.

16. The circulation system of claim 15, wherein the impeller magnet plate defines an opening to matingly receive the stem and wherein the opening and the stem have a noncircular cross sectional shape.

17. The circulation system of claim 16, comprising an external cover arranged between the impeller housing and the wall and sized to enclose the impeller magnet plate within the housing.

18. The circulation system of claim 15, comprising an air drawing tube having a first end opposite a second end, the first end positioned above a level of fluid in the container and the second end configured to attach to the housing to allow air to be drawn into the housing adjacent the impeller assembly.

19. The circulation system of claim 15, wherein the motor magnet plate includes a plurality of receptacles sized to receive the first plurality of rotational magnets, and the impeller magnet plate includes a plurality of receptacles sized to receive the second plurality of rotational magnets.

* * * * *

UNITED STATES PATENT AND TRADEMARK OFFICE
CERTIFICATE OF CORRECTION

| | | |
|---|---|---|
| PATENT NO. | : 8,944,786 B1 | Page 1 of 1 |
| APPLICATION NO. | : 12/838664 | |
| DATED | : February 3, 2015 | |
| INVENTOR(S) | : Eugene McDougall | |

It is certified that error appears in the above-identified patent and that said Letters Patent is hereby corrected as shown below:

On the title page item (60) Related U.S. Application Data

Left Column, line 12     Please delete "61/226,413" and insert --61/226,513-- therefor.

Signed and Sealed this
Twenty-second Day of March, 2016

Michelle K. Lee
*Director of the United States Patent and Trademark Office*